(12) United States Patent
Cho et al.

(10) Patent No.: US 10,068,971 B2
(45) Date of Patent: Sep. 4, 2018

(54) JUNCTIONLESS FIELD-EFFECT TRANSISTOR HAVING ULTRA-THIN LOW-CRYSTALLINE-SILICON CHANNEL AND FABRICATION METHOD THEREOF

(71) Applicant: Gachon University of Industry-Academic cooperation Foundation, Seongnam-si, Gyeonggi-do (KR)

(72) Inventors: Seongjae Cho, Seoul (KR); Youngmin Kim, Seongnam-si (KR)

(73) Assignee: GACHON UNIVERSITY OF INDUSTRY-ACADEMIC COOPERATION FOUNDATION, Seongnam-si, Gyeonggi-do (KR)

( * ) Notice: Subject to any disclaimer, the term of this patent is extended or adjusted under 35 U.S.C. 154(b) by 44 days.

(21) Appl. No.: 14/969,172

(22) Filed: Dec. 15, 2015

(65) Prior Publication Data
US 2017/0062565 A1    Mar. 2, 2017

(30) Foreign Application Priority Data
Aug. 31, 2015 (KR) .................. 10-2015-0123246

(51) Int. Cl.
*H01L 21/02* (2006.01)
*H01L 21/265* (2006.01)
(Continued)

(52) U.S. Cl.
CPC ...... *H01L 29/1033* (2013.01); *H01L 21/0262* (2013.01); *H01L 21/02164* (2013.01);
(Continued)

(58) Field of Classification Search
CPC ......... H01L 29/66757; H01L 29/78675; H01L 27/1214; H01L 27/12; H01L 29/78621; H01L 21/02164; H01L 21/02532; H01L 21/02595; H01L 21/0262; H01L 21/02694; H01L 21/26506; H01L 21/302; H01L 21/324; H01L 29/04; H01L 29/0649;
(Continued)

(56) References Cited

U.S. PATENT DOCUMENTS 5,981,990 A * 11/1999 Maeda .................. H01L 27/11
257/299
8,026,521 B1    9/2011 Or-Bach et al.
(Continued)

FOREIGN PATENT DOCUMENTS

KR    10-1431774    8/2014

*Primary Examiner* — Kenneth Parker
*Assistant Examiner* — Long H Le
(74) *Attorney, Agent, or Firm* — Gerald E. Hespos; Michael J. Porco; Matthew T. Hespos

(57) ABSTRACT

A junctionless field-effect transistor is provided and has an ultra-thin low-crystalline silicon channel. A fabrication method thereof also is provided for enabling greatly improved economics by significantly reducing the process costs while having electrical characteristics similar to those of the one formed on an SOI substrate by source/channel/drain regions formed in a junctionless ultra-thin low-crystalline silicon layer that has lower crystallinity than that of single-crystal silicon and that has a thickness of 20 nm or less on a bulk silicon substrate instead of an expensive SOI substrate.

4 Claims, 6 Drawing Sheets

(51) Int. Cl.
  *H01L 21/302* (2006.01)
  *H01L 21/324* (2006.01)
  *H01L 29/04* (2006.01)
  *H01L 29/06* (2006.01)
  *H01L 29/08* (2006.01)
  *H01L 29/10* (2006.01)
  *H01L 29/16* (2006.01)
  *H01L 29/40* (2006.01)
  *H01L 29/66* (2006.01)
  *H01L 29/423* (2006.01)

(52) U.S. Cl.
  CPC .. *H01L 21/02532* (2013.01); *H01L 21/02595* (2013.01); *H01L 21/02694* (2013.01); *H01L 21/302* (2013.01); *H01L 29/401* (2013.01); *H01L 29/66757* (2013.01); *H01L 21/02667* (2013.01)

(58) Field of Classification Search
  CPC ... H01L 29/0847; H01L 29/16; H01L 29/401; H01L 29/42376; H01L 29/66568
  See application file for complete search history.

(56) References Cited

U.S. PATENT DOCUMENTS

| | | | |
|---|---|---|---|
| 2006/0170053 A1* | 8/2006 | Yeo | H01L 21/84 257/353 |
| 2009/0305469 A1* | 12/2009 | Kato | H01L 21/84 438/151 |
| 2010/0276662 A1* | 11/2010 | Colinge | B82Y 10/00 257/9 |
| 2011/0217811 A1* | 9/2011 | Tanaka | H01L 31/03685 438/97 |
| 2014/0124783 A1* | 5/2014 | Kishida | H01L 29/7869 257/57 |
| 2014/0131769 A1* | 5/2014 | Park | H01L 29/267 257/190 |
| 2016/0127668 A1* | 5/2016 | Fujita | H01L 27/14603 348/308 |

* cited by examiner

US 10,068,971 B2

JUNCTIONLESS FIELD-EFFECT TRANSISTOR HAVING ULTRA-THIN LOW-CRYSTALLINE-SILICON CHANNEL AND FABRICATION METHOD THEREOF

CROSS-REFERENCE TO RELATED APPLICATION

This application claims priority to Korean Patent Application No. 10-2015-0123246, filed on Aug. 31, 2015, under 35 U.S.C. 119, the entire contents of which are hereby incorporated by reference.

BACKGROUND OF INVENTION

1. Field of the Invention

The present invention relates to a semiconductor device, and more particularly to a junctionless field-effect transistor having an ultra-thin low-crystalline-silicon channel and fabrication method thereof.

2. Description of the Related Art

A conventional field effect transistor, as shown in FIG. 1, is a MOSFET having a MOS structure as a Metal (gate electrode)-Oxide (gate dielectric layer)-Silicon (channel region) structure, consisting of source 210 and drain 220 regions formed by implanting with a dopant of a second conductive type (e.g., n-type) in a silicon substrate 100 of a first conductive type (e.g., p-type) and a gate electrode 400 being separated by a gate dielectric layer 300 and located over a channel region between the source and drain regions.

In the conventional field effect transistor mentioned above, junctions 120 can be come into being due to the source 210 and drain 220 regions formed by a dopant implantation and the junctions form a depletion region (not shown) by pn junctions.

By the being of the depletion regions, a voltage applied to the source and drain electrodes 500 and 600 can generate a current only flowing through a channel formed below the gate electrode 400. Namely, there is an effect being insulated by the depletion regions between the source region 210 and the other part of the silicon substrate 100 as a body region and between the drain region 220 and the body region.

However, there are some problems by the being of the depletion regions. It is a problem that a leakage current is induced in the depletion region formed on the side of the drain region by an impact ionization due to the collision of hot carriers or by the generation of electron-hole pairs due to the tunneling occurred in the overlapping part of the gate electrode and the drain region by a voltage difference between the gate electrode and the drain electrode. Also, it is another problem that the operation of a high frequency such as a cut-off frequency or a power transmission maximum frequency and the like is restricted by the being of the depletion region.

To solve the problems of the conventional MOSFET structure, U.S. Pat. No. 8,026,521B1 and U.S. Patent Publication No. 2010/0276662A1 disclose field effect transistors having a junctionless structure without forming the source/drain regions.

The junctionless field effect transistors developed so far, as shown in FIG. 2, are generally formed in a silicon-on-insulator (SOI) substrate having a buried oxide (BOX) 110 for blocking the leakage current, an active region being a single-crystal silicon layer 200 topped on the BOX 110 of the SOI substrate, and have a structure of source and drain electrodes 500 and 600 contacted directly on the single-crystal silicon layer 200 in both ends of a gate electrode 400 without additional formation of the source/drain regions.

However, because the SOI substrate is 10 to 20 times more expensive than a general bulk silicon substrate, the commercialization of the junctionless field effect transistor (JLFET) as a memory or logic semiconductor device is difficult.

To overcome the above problem, this inventor has already developed a fabrication method of a junctionless field effect transistor using a bulk silicon substrate for substituting an expensive SOI substrate with other inventors and obtained Korean Patent No. 10-1431774. As shown in FIG. 3, Korean Patent No. 10-1431774 discloses a compound junctionless field effect transistor enabled to form a blocking semiconductor layer 130 between a bulk silicon substrate 100 and an active layer 230 by a semiconductor material having a specific difference of energy bandgap from that of the active layer to substitute a buried oxide 110 of an SOI substrate for blocking a leakage current at the off-operation time, and to form the active layer 230 by a semiconductor layer having electron or hole mobility higher than that of silicon to operate perfectly though the doping concentration of the active layer is much lower.

However, Korean Patent No. 10-1431774 has difficult processes for forming a blocking semiconductor layer 130 by a first semiconductor material on a bulk silicon substrate 100, an active layer 230 by a second semiconductor material and the like because the processes should be performed by a heterojunction method under the proper conditions.

SUMMARY OF THE INVENTION

To overcome the problems of the prior junctionless field effect transistors, the object of the present invention is to provide a junctionless field-effect transistor having an ultra-thin low-crystalline silicon channel and fabrication method thereof. It has electrical characteristics similar to those of the one formed on an SOI substrate by having a channel thickness and gate length smaller than the grain size of silicon in the case of having an ultra-thin polycrystalline silicon channel and it can be fabricated on a bulk silicon substrate instead of an expensive SOI substrate by directly applying the conventional silicon CMOS process.

To achieve the object, a junctionless field-effect transistor according to the present invention comprises: a bulk silicon substrate; a silicon oxide layer formed on the silicon substrate; an ultra-thin junctionless low-crystalline silicon layer formed with a thickness of 20 nm or less on the silicon oxide layer; a gate electrode formed to be separated by a gate dielectric layer on the low-crystalline silicon layer; and source and drain electrodes formed with a specific interval from each other and separated by the gate electrode on the low-crystalline silicon layer.

The low-crystalline silicon layer may be a polycrystalline silicon layer. The thickness of the polycrystalline silicon layer and the length of the gate electrode are preferably smaller than the grain size of the polycrystalline silicon layer.

The thickness of the polycrystalline silicon layer and the length of the gate electrode are more preferably 10 to 1000 times smaller than the grain size of the polycrystalline silicon layer.

The length of the gate electrode may be 20 nm or less, a channel region under the gate electrode in the low-crystalline silicon layer may have a dopant concentration of $10^{17}$~$10^{19}$/cm$^3$ and the other regions except the channel region in the low-crystalline silicon layer may have a dopant concentration higher than that of the channel region.

A method for fabricating a junctionless field-effect transistor according to the present invention comprises: a first step of forming a silicon oxide layer on a bulk silicon substrate; a second step of forming an ultra-thin junctionless low-crystalline silicon layer with a thickness of 20 nm or less on the silicon oxide layer; a third step of forming a gate dielectric layer and a gate electrode sequentially on the low-crystalline silicon layer; and a fourth step of forming source and drain electrodes to be separated by the gate electrode on the low-crystalline silicon layer.

The low-crystalline silicon layer may be a polycrystalline silicon layer. The second step may further comprise a planarization process after raising the grain size of the polycrystalline silicon layer to be larger than the thickness of the polycrystalline silicon layer.

The second step may form an ultra-thin junctionless low-crystalline silicon layer with the thickness of 20 nm or less at the slow depositing speed by a chemical vapor deposition (CVD) process at a low temperature of 500~700° C.

The second step may further comprise a high-temperature heating process at a temperature of above 700° C. after forming the low-crystalline silicon layer for transforming the low-crystalline silicon layer into a polycrystalline silicon layer.

The third step may further comprise an ion implantation process after forming the gate electrode and before removing a gate dielectric layer exposed around the gate electrode.

The third step may further comprise an annealing process after the ion implantation process for transforming the low-crystalline silicon layer into a polycrystalline silicon layer and adjust processing conditions of the annealing process for raising the grain size of the polycrystalline silicon layer 10 to 1000 times larger than the thickness of the polycrystalline silicon layer.

By a channel formed of an ultra-thin junctionless low-crystalline silicon layer having a thickness of 20 nm or less on a bulk silicon substrate instead of an expensive SOI substrate, the present invention can greatly improve the economics by significantly reducing the process costs and directly use the conventional silicon CMOS process. The present invention can also transform a low-crystalline silicon layer into a polycrystalline silicon layer by an appropriate adjustment of process conditions such as annealing and the like. And by raising the grain size of the polycrystalline silicon layer and fabricating the channel thickness and gate length much smaller than the grain size, the present invention also enables electrical characteristics such as a transfer characteristic, a switching characteristic, a gate capacitance, a delay time and the like similar to those of the one fabricated on an SOI substrate.

In these drawings, the following reference numbers are used throughout: reference number 10 indicates a bulk silicon substrate, 20 a silicon oxide layer, 30 a low-crystalline silicon layer, 32 a grain, 40 a gate dielectric layer, 50 a gate electrode, 60 a source electrode and 70 a drain electrode.

DETAILED DESCRIPTION

Detailed descriptions of preferred embodiments of the present invention are provided below with reference to accompanying drawings.

Figure 9:
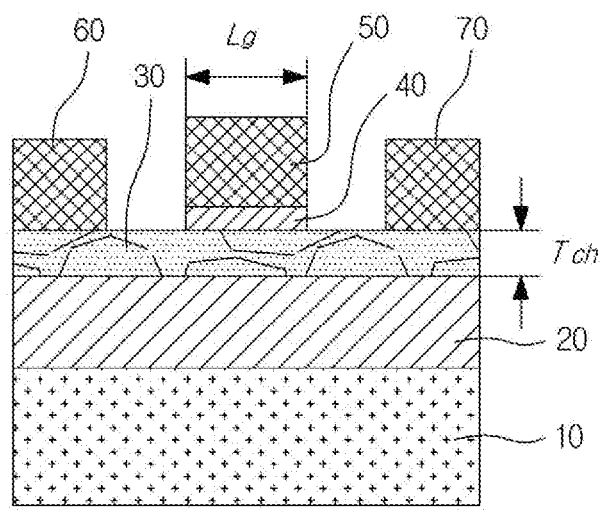

A junctionless field-effect transistor according to an embodiment of the present invention, as shown in FIG. 9, comprises: a bulk silicon substrate 10; a silicon oxide layer 20 formed on the silicon substrate; an ultra-thin junctionless low-crystalline silicon layer 30 formed with a thickness of 20 nm or less on the silicon oxide layer; a gate electrode 50 formed to be separated by a gate dielectric layer 40 on the low-crystalline silicon layer 30; and source and drain electrodes 60 and 70 formed with a specific interval from each other and separated by the gate electrode 50 on the low-crystalline silicon layer 30.

Figure 1:
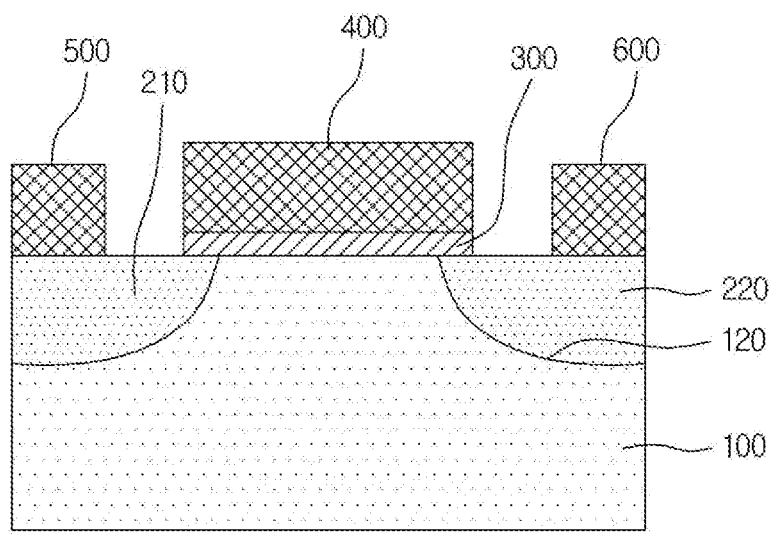
FIG. 1 is a cross sectional view of a conventional junction field-effect transistor showing a junction structure according to the formation of source/drain regions.
Figure 2:
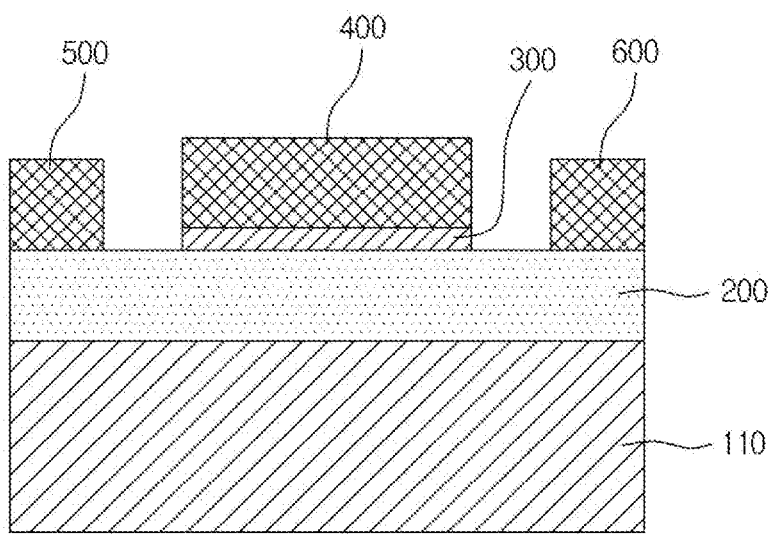
FIG. 2 is a cross sectional view showing a structure of a conventional junctionless field-effect transistor fabricated on an SOI substrate.
Figure 3:
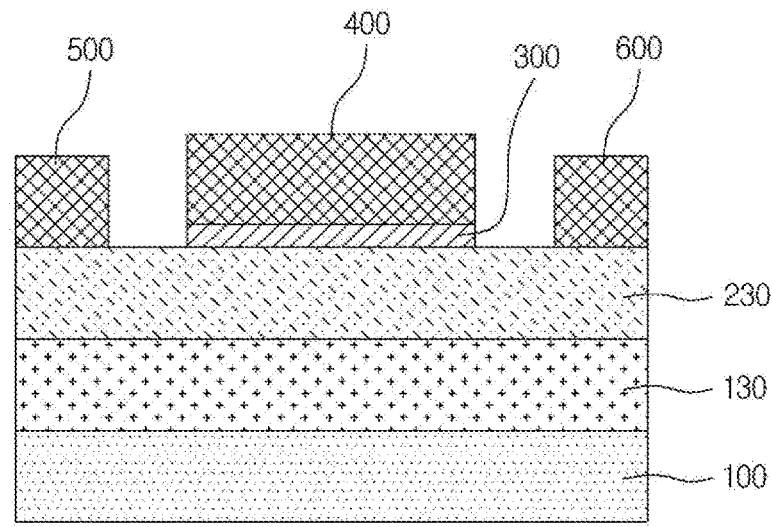
FIG. 3 is a cross sectional view showing a structure of a junctionless field-effect transistor disclosed in Korean Patent No. 10-1431774.

In the embodiment and this description, the term "ultra-thin" means a silicon layer formed with a thickness of 20 nm or less, the term "junctionless" means the absence of pn junctions 120 caused by forming source 210 and drain 220 regions having a different conductive type from a silicon substrate 100 in the structure of a conventional filed-effect transistor as shown in FIG. 1, the term "low-crystalline silicon layer" means a silicon layer having a low crystallinity including an amorphous structure without crystallinity, namely, a silicon layer having a polycrystalline or amorphous structure but not a single-crystal structure, and the term "silicon oxide layer" means an electrically insulating layer that does not have any lattice constant and that is not a doped conductive material, as widely known in the art. And the "single-crystal", "polycrystalline" and "amorphous" structures of f-silicon are based on the general meanings used in a semiconductor technology.

The principal technical idea of the present invention including the embodiment is to implement a junctionless field-effect transistor having a channel formed of an ultra-thin junctionless low-crystalline silicon layer 30 with a thickness of 20 nm or less for having electric characteristics very similar to those of the one having a channel of a single-crystal silicon layer in an SOI substrate.

To maximize the above mentioned effect, the length (Lg) of the gate electrode 50 is also preferably limited 20 nm or less.

Additionally, a channel region under the gate electrode 50 in the low-crystalline silicon layer 30 is doped with a dopant concentration of $10^{17}$~$10^{19}$/cm$^3$ and the other regions except the channel region is preferably doped to have a dopant concentration higher than the above dopant concentration. If the dopant concentration of the channel region is less than the lowest limit of the range or more than the highest limit, the operating current at an ON state is reduced and the leakage current at an OFF state is raised, respectively. Thus, the switching characteristic (i.e., $I_{ON}/I_{OFF}$ ratio) is worse.

The low-crystalline silicon layer 30 may be a polycrystalline silicon layer. The thickness (i.e., a channel thickness, Tch) of the polycrystalline silicon layer 30 and the length (Lg) of the gate electrode 50 are preferably smaller than the size of grain 32 of the polycrystalline silicon layer. By this configuration, it is more similar to the electric characteristics of the junctionless field-effect transistor fabricated in a single-crystal silicon layer of an SOI substrate.

More preferably, the thickness (Tch) of the polycrystalline silicon layer 30 and the length (Lg) of the gate electrode 50 are 10 to 1000 times smaller than the grain size of the polycrystalline silicon layer for minimizing a grain boundary of the polycrystalline silicon in the channel region under the gate electrode 50. Here, by exceeding the range, if the thickness (Tch) of the polycrystalline silicon layer 30 and the length (Lg) of the gate electrode 50 are small 1000 times above or 10 times below the grain size, it causes some problems. The former has a difficult process that excessively raises the grain size of the polycrystalline silicon 10 μm or more though one to two or more of the grain boundaries of the polycrystalline silicon in the channel region is formed or not. The latter is not shown the expected performances because many grain boundaries of the polycrystalline silicon are placed in the channel region due to the difference of less than 10 times.

In the above embodiment, the gate electrode 50 is not limited to the cross-sectional structure exemplarily shown in FIG. 9 and can have the known structure such as a Gate-All-Around (GAA) type, a FinFET type or a Double Gate type. Furthermore, the junctionless field-effect transistor having a 3D stacked structure can be implemented.

Next, a detailed description of a fabrication method of a junctionless field-effect transistor mentioned above according to an embodiment of the present invention is provided with reference to FIGS. 4 to 9.

Figure 4:
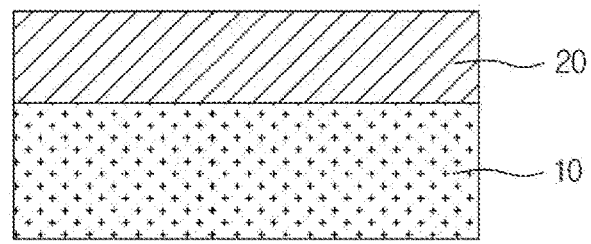
FIGS. 4 to 9 are cross sectional views of a process showing a fabrication method of a junctionless field-effect transistor according to an embodiment of the present invention.

First, as shown in FIG. 4, a silicon oxide layer 20 having a predetermined thickness is formed on a bulk silicon substrate 10 (a first step).

Here, the silicon oxide layer 20 may be formed by the conventional method such as a dry/wet oxidation, a chemical vapor deposition and the like and the deposition thickness may be a range of several nm to several μm.

Figure 5:
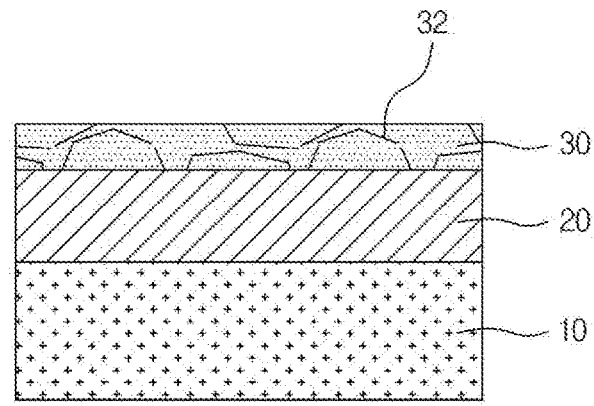

Then, as shown in FIG. 5, an ultra-thin junctionless low-crystalline silicon layer 30 with a thickness of 20 nm or less is formed on the silicon oxide layer 20 (a second step).

A method of forming the low-crystalline silicon layer 30 may be various, but it is preferable to implement any one of the following three methods.

A first method may be implemented to form the low-crystalline silicon layer 30 as a polycrystalline silicon layer by the known method and form an ultra-thin with a thickness of 20 nm or less by further processing the known planarization process such as CMP and the like after raising the grain size of the polycrystalline silicon layer to be larger than the thickness (Tch) of the polycrystalline silicon layer.

A second method may form an ultra-thin junctionless low-crystalline silicon layer 30 with a thickness of 20 nm or less at the slow depositing speed by a chemical vapor deposition process at a low temperature (preferably, 500~700° C.).

Final, a third method may transform an amorphous into a polycrystalline silicon layer by further processing a high-temperature heating process at a temperature of above 700° C. after forming the low-crystalline silicon layer 30 by the second method.

The reference number 32 in FIG. 5 conceptually indicates a grain of amorphous silicon. The dopant doping of the low-crystalline silicon layer 30 may be simultaneously processed together with the formation of the low-crystalline silicon layer or may be processed by a predetermined ion implantation process after forming of the low-crystalline silicon layer 30. By this process, the low-crystalline silicon layer 30 may be basically doped with the dopant concentration of $10^{17}$~$10^{19}$/cm$^3$.

Figure 6:
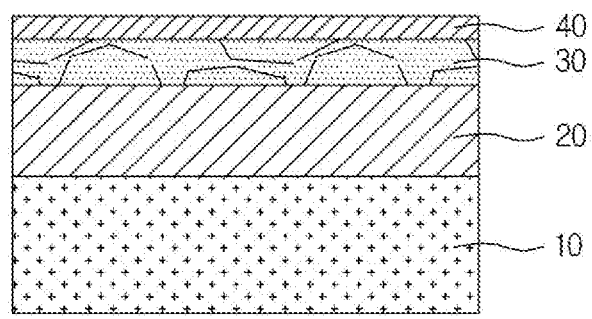
Figure 7:
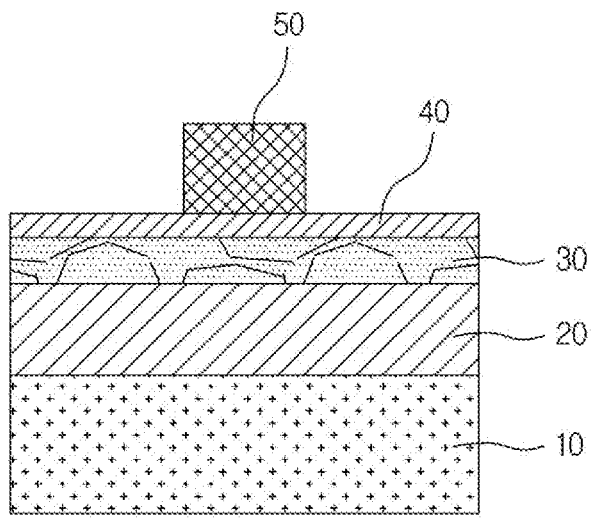
Figure 8:
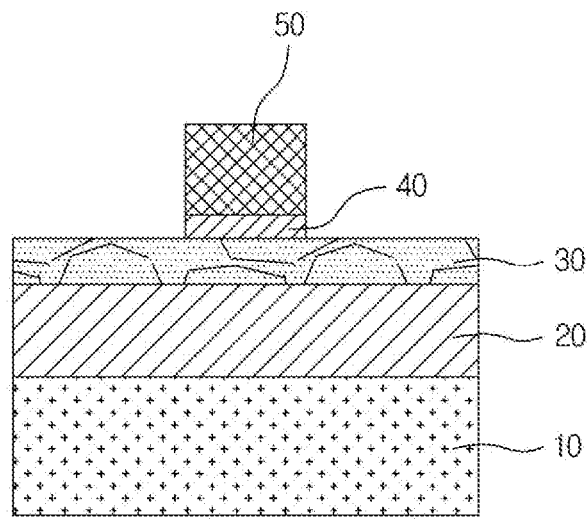

Next, as shown in FIGS. 6 to 8, a gate dielectric layer 40 and a gate electrode 50 are sequentially formed on the low-crystalline silicon layer 30 (a third step).

Here, as shown in FIG. 7, after forming the gate electrode 50, an ion implantation process is further processed before removing a gate dielectric layer 40 exposed around the gate electrode 50. Thus, when the gate electrode 50 is formed of silicon materials, the regions in the low-crystalline silicon layer 30 including the gate electrode 50 except the channel region under the gate electrode 50 are preferably doped with a dopant to have a higher dopant concentration (e.g., $10^{21}$/cm$^3$) than the dopant concentration of the channel region under the gate electrode 50.

Furthermore, after the ion implantation process, an annealing process is further processed for transforming the low-crystalline silicon layer into a polycrystalline silicon layer and processing conditions of the annealing process are preferably adjusted for raising the grain size of the polycrystalline silicon layer 10 to 1000 times larger than the thickness of the polycrystalline silicon layer.

The gate dielectric layer 40 may be formed of a silicon oxide layer by a dry oxidation, RTO and the like or may be deposited of a high-oxide layer by an atomic layer deposition (ALD). Here, the deposition thickness is preferably below 3 nm of an equivalent oxide thickness (EOT).

The gate electrode 50 may be formed of silicon materials such as polycrystalline silicon, amorphous silicon and the like or metals. As the embodiments of the above mentioned device structures, the length (Lg) of gate electrode 50 is preferably 20 nm or less (more preferably, Lg is 10~20 nm).

Finally, as shown in FIG. 9, source and drain electrodes are formed to be separated by the gate electrode on the low-crystalline silicon layer 30 (a fourth step).

The other undescribed processes may be processed by the conventional silicon CMOS process.

Figure 10:
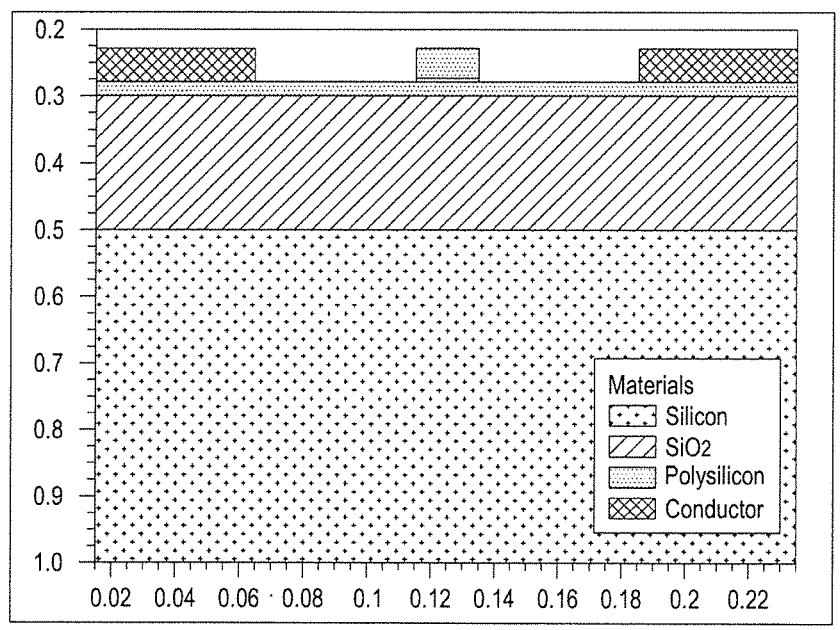
FIG. 10 is a mesh structure view used in a simulation for analyzing electrical characteristics of the junctionless field-effect transistor shown in FIG. 9.
Figure 11:
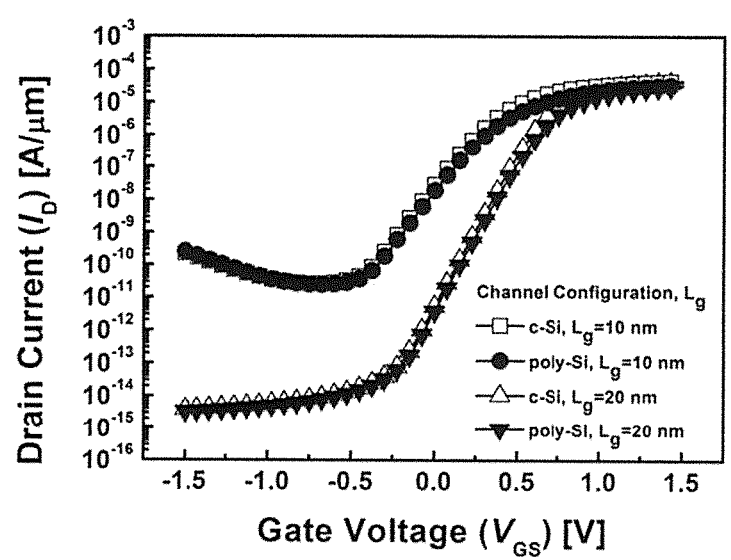
FIGS. 11 to 13 are electrical characteristic views showing the relationship of a gate length to a transfer characteristic, a switching characteristic, a gate capacitance and a delay time, respectively, in junctionless field-effect transistors having a polycrystalline silicon channel according to an embodiment of the present invention or a single-crystal silicon channel of an SOI substrate.

FIG. 10 is a mesh structure view used in a simulation for analyzing electrical characteristics of the junctionless field-effect transistor shown in FIG. 9. The x-axis is numbered from 0.02 mm at the left end by adding 0.02 mm at each interval and the y-axis is numbered from 0.2 nm at the top end to the bottom by adding 0.1 nm at each interval.

Figure 12:
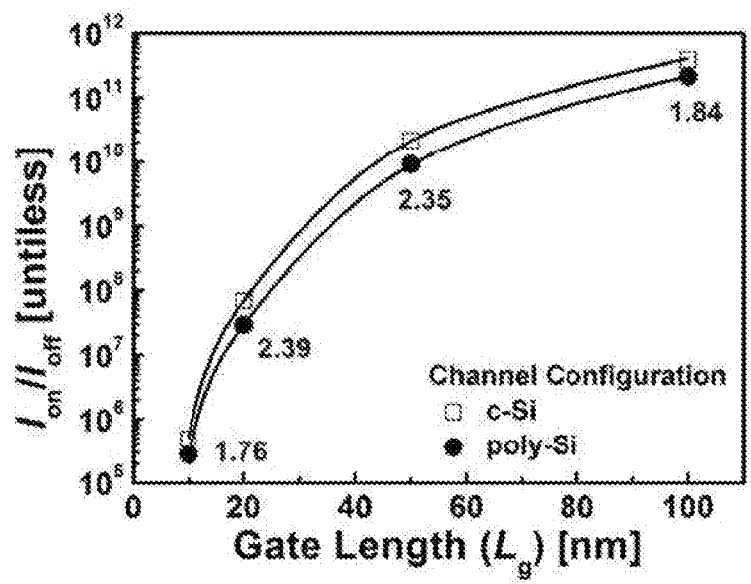

FIG. 12 is an electrical characteristic view showing the relationship of a switching characteristic ($I_{ON}/I_{OFF}$ ratio) between junctionless field-effect transistors having a polycrystalline silicon channel according to an embodiment of the present invention and a single-crystal silicon channel in an SOI substrate. By this view, when the length (Lg) of the gate electrode is 20 nm or less, it is known that the switching characteristics are almost equal to each other.

Figure 13:
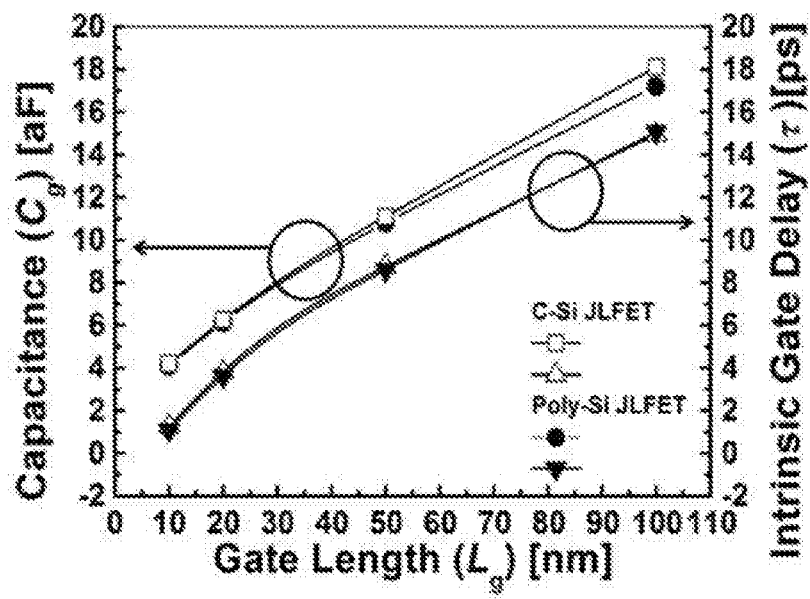

FIG. 13 is an electrical characteristic view showing the relationship of a gate capacitance (Cg) and a delay time (τ) between junctionless field-effect transistors having a polycrystalline silicon channel according to an embodiment of the present invention and a single-crystal silicon channel in an SOI substrate. By this view, when the length (Lg) of the gate electrode is 10 nm or 20 nm, the characteristics are almost equal to each other.

This work was supported by the National Research Foundation of Korea (NRF) funded by the Ministry of Science, ICT & Future Planning (NRF-2014R1A1A1003644).

What is claimed is:

1. A junctionless field-effect transistor comprising:
   a bulk silicon substrate;
   a silicon oxide layer formed on the silicon substrate;
   an ultra-thin junctionless low-crystalline silicon layer formed with a thickness of 20 nm or less on the silicon oxide layer;
   a gate electrode formed to be separated by a gate dielectric layer on the low-crystalline silicon layer; and
   source and drain electrodes formed with a specific interval from each other and separated by the gate electrode on the low-crystalline silicon layer,
   wherein the low-crystalline silicon layer is a polycrystalline silicon layer, and
   wherein the thickness of the polycrystalline silicon layer and the length of the gate electrode are smaller than the grain size of the polycrystalline silicon layer.

2. The junctionless field-effect transistor of claim 1, wherein the thickness of the polycrystalline silicon layer and the length of the gate electrode are 10 to 1000 times smaller than the grain size of the polycrystalline silicon layer.

3. The junctionless field-effect transistor of claim 2,
   wherein the length of the gate electrode is 20 nm or less,
   wherein a channel region under the gate electrode in the low-crystalline silicon layer has a dopant concentration of $10^{17}$~$10^{19}$/cm$^3$, and
   wherein the other regions except the channel region in the low-crystalline silicon layer have a dopant concentration higher than that of the channel region.

4. The junctionless field-effect transistor of claim 1,
   wherein the length of the gate electrode is 20 nm or less,
   wherein a channel region under the gate electrode in the low-crystalline silicon layer has a dopant concentration of $10^{17}$~$10^{19}$/cm$^3$, and
   wherein the other regions except the channel region in the low-crystalline silicon layer have a dopant concentration higher than that of the channel region.

* * * * *